United States Patent
Sakakibara

(10) Patent No.: US 7,616,146 B2
(45) Date of Patent: Nov. 10, 2009

(54) A/D CONVERSION CIRCUIT, CONTROL METHOD THEREOF, SOLID-STATE IMAGING DEVICE, AND IMAGING APPARATUS

(75) Inventor: Masaki Sakakibara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/156,222

(22) Filed: May 30, 2008

(65) Prior Publication Data

US 2008/0303705 A1 Dec. 11, 2008

(30) Foreign Application Priority Data

Jun. 6, 2007 (JP) .......................... P2007-149904

(51) Int. Cl.
*H03M 1/34* (2006.01)

(52) U.S. Cl. ...................................... 341/164; 341/155

(58) Field of Classification Search .......... 341/155–165
See application file for complete search history.

(56) References Cited

U.S. PATENT DOCUMENTS

| | | | | |
|---|---|---|---|---|
| 5,392,043 | A * | 2/1995 | Ribner | 341/143 |
| 6,653,967 | B2 * | 11/2003 | Hamashita | 341/172 |
| 6,967,611 | B2 * | 11/2005 | Atriss et al. | 341/172 |
| 7,009,549 | B1 * | 3/2006 | Corsi | 341/161 |
| 7,126,523 | B2 * | 10/2006 | Tadeparthy | 341/162 |
| 7,224,306 | B2 * | 5/2007 | Kobayashi | 341/155 |
| 7,265,705 | B1 * | 9/2007 | Lee et al. | 341/162 |
| 7,289,055 | B2 * | 10/2007 | Kobayashi et al. | 341/161 |
| 7,319,419 | B1 * | 1/2008 | Lash et al. | 341/118 |
| 7,417,574 | B2 * | 8/2008 | Tadeparthy et al. | 341/155 |
| 7,453,389 | B1 * | 11/2008 | Vu et al. | 341/172 |
| 7,511,648 | B2 * | 3/2009 | Trifonov et al. | 341/143 |

FOREIGN PATENT DOCUMENTS

| | | |
|---|---|---|
| JP | 2002-320146 | 10/2002 |
| JP | 2005-027232 | 1/2005 |
| JP | 2005-136540 | 5/2005 |
| JP | 2005-269471 | 9/2005 |

* cited by examiner

*Primary Examiner*—Lam T Mai
(74) *Attorney, Agent, or Firm*—Robert J. Depke; Rockey, Depke & Lyons, LLC

(57) ABSTRACT

An A/D conversion circuit includes: an input capacitance to which an input signal and a reference signal are sequentially applied; an operational amplifier; a first switch connected between the other end of the input capacitance and a first input end of the operational amplifier; a feedback capacitance connected to the first input end of the operational amplifier; a second switch connected between the other end of the feedback capacitance and an output end of the operational amplifier; a third switch selectively applying a predetermined voltage to the other end of the feedback capacitance; a fourth switch selectively causing a short circuit between the first input end and the output end of the operational amplifier; a fifth switch applying the predetermined voltage to a second input end of the operational amplifier; and a sixth switch applying a ramp reference voltage to the second input end of the operational amplifier.

9 Claims, 12 Drawing Sheets

US 7,616,146 B2

A/D CONVERSION CIRCUIT, CONTROL METHOD THEREOF, SOLID-STATE IMAGING DEVICE, AND IMAGING APPARATUS

CROSS REFERENCES TO RELATED APPLICATIONS

The present invention contains subject matter related to Japanese Patent Application JP 2007-149904 filed in the Japanese Patent Office on Jun. 6, 2007, the entire contents of which being incorporated herein by reference.

BACKGROUND OF THE INVENTION

1. Field of the Invention

The present invention relates to an analog-to-digital (A/D) conversion circuit, a control method thereof, a solid-state imaging device, and an imaging apparatus. In particular, the present invention relates to an A/D conversion circuit having a comparator, a control method thereof, a solid-state imaging device using the A/D conversion circuit, and an imaging apparatus having the solid-state imaging device.

2. Description of the Related Art

In the solid-state imaging device, for example, the CMOS (Complementary Metal Oxide Semiconductor), it may be difficult to achieve small area occupation of a circuit part and noise reduction at the same time. To reduce noise in the CMOS image sensor, there is known a technology that, in a readout circuit (column circuit), which is arranged for each column of a pixel arrangement of a pixel array part to read out signals from pixels, reduces noise by performing an arithmetic on a narrow noise band signal on the basis of a capacitance ratio using a switched capacitor circuit to amplify the signal, and inputting and converting the amplified signal (for example, see JP-A-2005-269471).

By simply incorporating an integral-type A/D conversion circuit, which is advantageous in terms of the area, with the signal amplifying circuit, it is possible to realize a readout circuit, which can perform A/D conversion while reducing noise.

SUMMARY OF THE INVENTION

In the related art, in the readout circuit, which is arranged for each column of the pixel arrangement of pixel array part to read out the signals from the pixels, a circuit part is divided into a signal amplifying part and an A/D converting part. For this reason, even if the area of each circuit is optimized, the total area of the readout circuit may not become smaller than the area when the signal amplifying circuit and the A/D conversion circuit are simply incorporated with each other.

The signal amplifying circuit, which is constituted from the switched capacitor circuit, performs signal amplification, and a comparator, which constitutes the A/D conversion circuit, performs signal comparison of a pixel signal and at least one reference direct current voltage. That is, the readout circuit is constituted from independent functional circuits. For this reason, the occupation area of the readout circuit may not be reduced.

Accordingly, there is a need for an A/D conversion circuit, which can reduce an occupation area of a readout circuit (column circuit), a control method thereof, a solid-state imaging device using the A/D conversion circuit, and an imaging apparatus having the solid-state imaging device.

According to an embodiment of the invention, there is provided an A/D conversion circuit. The A/D conversion circuit includes: an input capacitance, to one end of which an input signal and a reference signal are sequentially applied; an operational amplifier; a first switch that is connected between the other end of the input capacitance and a first input end of the operational amplifier, and is turned on at the time of a signal amplification operation; a feedback capacitance, one end of which is connected to the first input end of the operational amplifier; a second switch that is connected between the other end of the feedback capacitance and an output end of the operational amplifier, and is turned on when an electric charge accumulated in the input capacitance is transferred to the feedback capacitance; a third switch that selectively applies a predetermined voltage to the other end of the feedback capacitance when the input signal is applied to the one end of the input capacitance or at the time of an A/D conversion operation; a fourth switch that, when the input signal is applied to the one end of the input capacitance, selectively causes a short circuit between the first input end and the output end of the operational amplifier; a fifth switch that, when the input signal and the reference signal are applied to the one end of the input capacitance, applies the predetermined voltage to a second input end of the operational amplifier; and a sixth switch that is turned on at the time of the A/D conversion operation to apply a ramp reference voltage to the second input end of the operational amplifier.

In the A/D conversion circuit having the above-described configuration, first, the first switch, the third switch, the fourth switch, and the fifth switch are turned on to sample and hold the input signal in the input capacitance. Next, the second switch is turned on, and the third switch and the fourth switch are turned off to apply the reference signal to the one end of the input capacitance, and to transfer an electric charge accumulated in the input capacitance to the feedback capacitance, thereby performing the signal amplification operation. After the signal amplification operation, the first switch, the second switch, and the fourth switch are turned off, and the third switch and the fifth switch are turned on to apply the ramp reference voltage to the second input end of the operational amplifier through the fifth switch, thereby performing the A/D conversion operation.

According to the embodiments of the invention, by performing the signal amplification operation at different times using the circuit elements of the A/D conversion circuit, the circuit elements can be commonly used for A/D conversion and signal amplification. Therefore, the occupation area of the A/D conversion circuit can be reduced, compared with a case where the signal amplifying circuit is simply incorporated with the A/D conversion circuit.

DETAILED DESCRIPTION OF THE INVENTION

Hereinafter, an embodiment of the invention will be described in detail with reference to the drawings.

Figure 1:
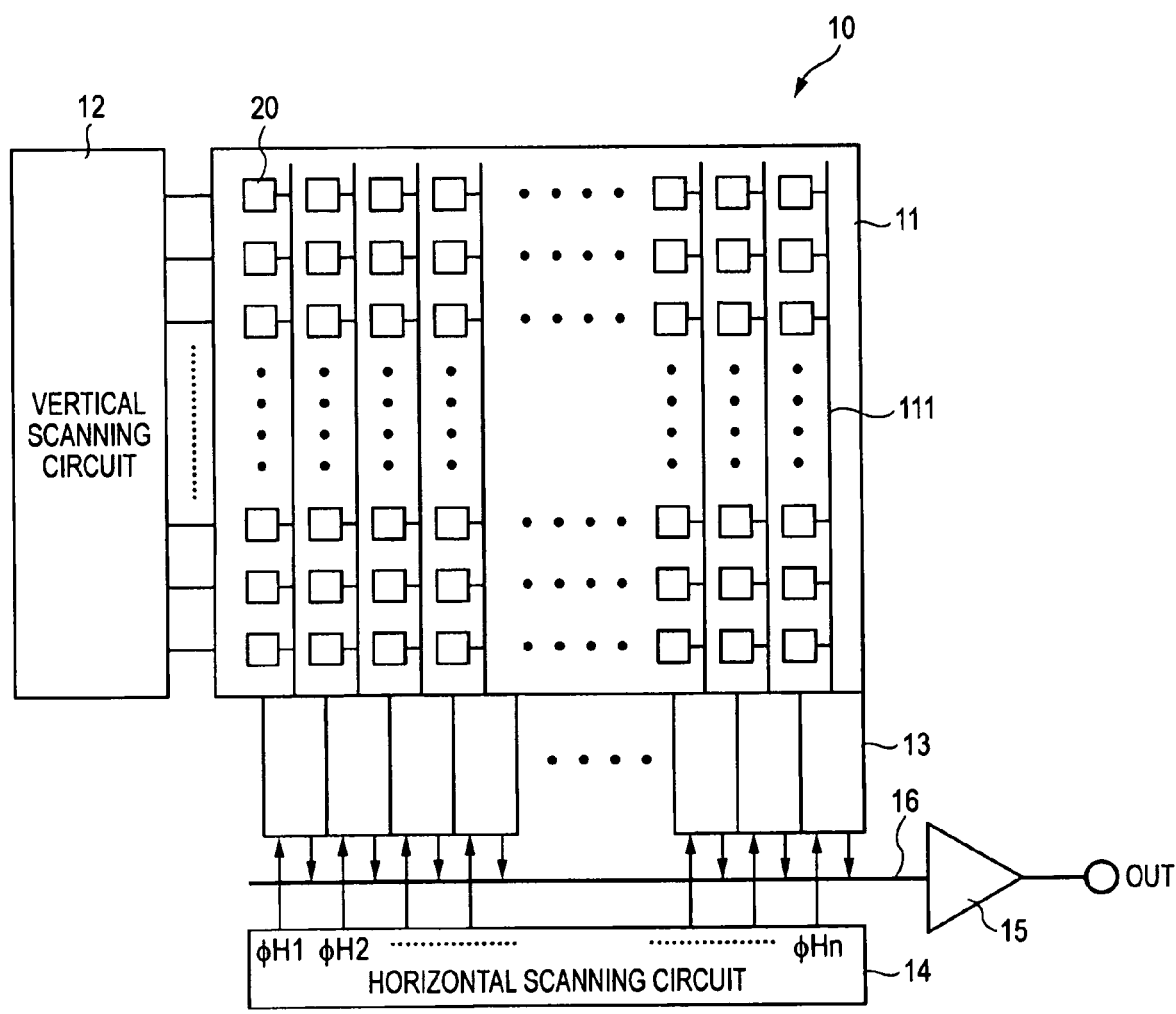
FIG. 1 is a system configuration diagram showing an example of a CMOS image sensor to which the invention is applied.

FIG. 1 is a system configuration diagram showing an example of a solid-state imaging element, for example, a CMOS image sensor, to which the invention is applied.

As shown in FIG. 1, a CMOS image sensor 10 according to this embodiment includes a pixel array part 11, in which unit pixels (hereinafter, also simply referred to as 'pixel') 20 each having a photoelectric conversion element are arranged in a matrix and in a two-dimensional manner, and peripheral circuits.

The peripheral circuits of the pixel array part 11 include, for example, a vertical scanning circuit 12, a column circuit 13, a horizontal scanning circuit 14, an output circuit 15, and the like. These circuits are integrated on the same chip (semiconductor substrate) as the pixel array part 11.

Figure 2:
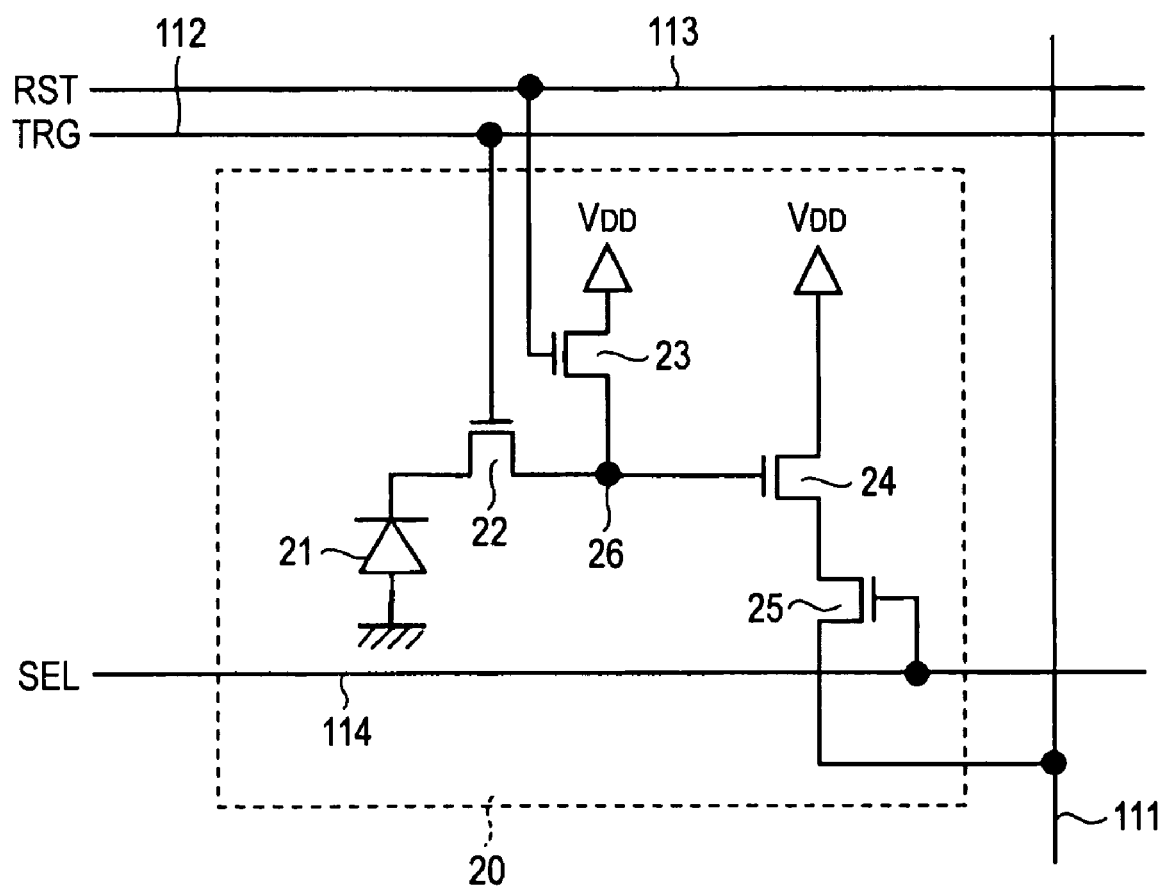
FIG. 2 is a circuit diagram showing an example of a unit pixel.

In the matrix arrangement of the pixel array part 11, a vertical signal line 111 is wired for each column, and driving control lines, for example, a transfer control line 112, a reset control line 113, and a selection control line 114, are wired for each row (see FIG. 2).

The vertical scanning circuit 12 has a shift register, an address decoder, and the like. The vertical scanning circuit 12 performs an electronic shutter operation on an electronic shutter row to discard the signals of the pixels 20 in that row, while scanning the pixels 20 of the pixel array part 11 on a row basis for an electronic shutter row and a readout row in a vertical direction (up/down direction). In addition, the vertical scanning circuit 12 performs a readout operation on the readout row to read out the signals of the pixels 20 in that row.

Though not shown, the vertical scanning circuit 12 has a readout scanning system that performs the readout operation to read out the signals of the pixels 20 in the readout row, while sequentially scanning the pixels 20 on the row basis, and an electronic shutter scanning system that performs the electronic shutter operation on the same row (electronic shutter row) earlier than readout scanning by the readout scanning system by the time corresponding to the shutter speed.

A period from a time, at which an unnecessary electric charge in a photoelectric converting part is reset according to shutter scanning by the electronic shutter scanning system, to a time, at which the signal of the pixel 20 is read out by readout scanning by the readout scanning system, becomes a signal charge accumulation period (exposure period) in the pixel 20. That is, the electronic shutter operation refers to an operation to reset (discard) the signal charge accumulated in the photoelectric converting part and to start to newly accumulate a signal charge after the reset.

The column circuit 13 is arranged, for example, for each pixel column in the pixel arrangement of the pixel array part 11. That is, the column circuit 13 is arranged in a one-to-one correspondence with respect to the pixel column. The column circuit 13 is a readout circuit that reads out the signals to be output from the pixels 20 in the readout row (selected row) through the vertical signal line 111 by vertical scanning of the vertical scanning circuit 12. Then, the column circuit 13 performs a predetermined signal processing on the read pixel signals and simultaneously temporarily stores the pixel signals after the signal processing.

More specifically, the column circuit 13 performs various processing, including a noise reducing processing (for example, a CDS (Correlated Double Sampling) processing) to reduce reset noise or fixed pattern noise unique to the pixel, such as a variation in a threshold value of an amplification transistor 24 (see FIG. 2), on the pixel signals to be output from the pixels 20 in the selected row through the vertical signal line 111.

The column circuit 13 further has an analog-to-digital conversion circuit that converts the analog pixel signals into digital pixel signals. This embodiment is characterized by the concrete configuration and operation of the A/D conversion circuit used in the column circuit 13, and the details thereof will be described below.

Here, the column circuit 13 is provided for each column in the pixel arrangement of the pixel array part 11, but a single column circuit 13 may be provided for every multiple columns. In this case, the single column circuit 13 may be used among the multiple columns in a time division manner.

The horizontal scanning circuit 14 has a shift register, an address decoder, and the like. The horizontal scanning circuit 14 sequentially drives the column circuits 13 arranged to correspond to the pixel columns of the pixel array part 11 by sequentially outputting horizontal selection pulses φH1 to φHn, and sequentially driving horizontal selection switches (not shown) provided at the output ends of the column circuits 13, and reads out the pixel signals, which are temporarily stored in the column circuit 13, to the horizontal signal line 16.

The output circuit 15 performs various processing on the pixel signals, which are transmitted through the horizontal signal line 16. For example, in the output circuit 15, signal processing, such as black-level adjustment, column-variation correction, color processing, and the like, may be performed. In addition, only a buffering processing may be performed.

Timing signals for reference of the operations of the vertical scanning circuit 12, the column circuit 13, the horizontal scanning circuit 14, the output circuit 15, and the like, and control signals are generated by a timing control circuit (timing generator) (not shown).

(Pixel Circuit)

FIG. 2 is a circuit diagram showing an example of a unit pixel 20.

The unit pixel 20 according to this example is a pixel circuit that has, in addition to a photoelectric conversion element, for example, a photodiode 21, four transistors, that is, a transfer transistor 22, a reset transistor 23, an amplification transistor 24, and a selection transistor 25. Here, N-channel MOS transistors are used as the transistors 22 to 25, but the invention is not limited thereto.

The transfer transistor 22 is connected between a cathode of the photodiode 21 and a floating diffusion part (hereinafter, referred to as "FD part") 26. The transfer transistor 22 transfers a signal charge (in this case, an electron), which is photoelectrically converted by and accumulated in the photodiode 21, to the FD part 26 when a transfer pulse TRG is applied to a gate electrode (control electrode) thereof. The FD part 26 functions as a charge voltage converting part that converts the signal charge into a voltage signal.

The reset transistor 23 has a drain electrode connected to a pixel power supply of a power supply voltage VDD, and a source electrode connected to the FD part 26. The reset transistor 23 resets the potential of the FD part 26 to the power supply voltage VDD when a reset pulse RST is applied to a gate electrode thereof before the signal charge is transferred from the photodiode 21 to the FD part 26.

The amplification transistor 24 has a gate electrode connected to the FD part 26, and a drain electrode connected to the pixel power supply of the power supply voltage VDD. The amplification transistor 24 outputs the potential of the FD part 26 at a reset level (P-phase signal) after being reset by the reset transistor 23, and outputs the potential of the FD part 26 at a signal level (D-phase signal) after the transfer transistor 22 transfers the signal charge.

The selection transistor 25 has, for example, a drain electrode connected to the source electrode of the amplification transistor 24, and a source electrode connected to the vertical signal line 111. When a selection pulse SEL is applied to a gate electrode of the selection transistor 25, the pixels 20 are selected, and the signals output from the amplification transistor 24 are output to the vertical signal line 111. The selection transistor 25 may be connected between the pixel power supply and the drain electrode of the amplification transistor 24.

Here, the invention has been applied to the CMOS image sensor having the four-transistor type unit pixel 20, which has the transfer transistor 22, the reset transistor 23, the amplification transistor 24, and the selection transistor 25. However, the invention is not limited thereto.

Specifically, the selection transistor 25 may be omitted, and the voltage value of the power supply voltage VDD may be switched. If so, the invention may be applied to a CMOS image sensor having a three-transistor type unit pixel, in which the amplification transistor 24 also functions as the selection transistor 25.

[A/D Conversion Circuit]

Figure 3:
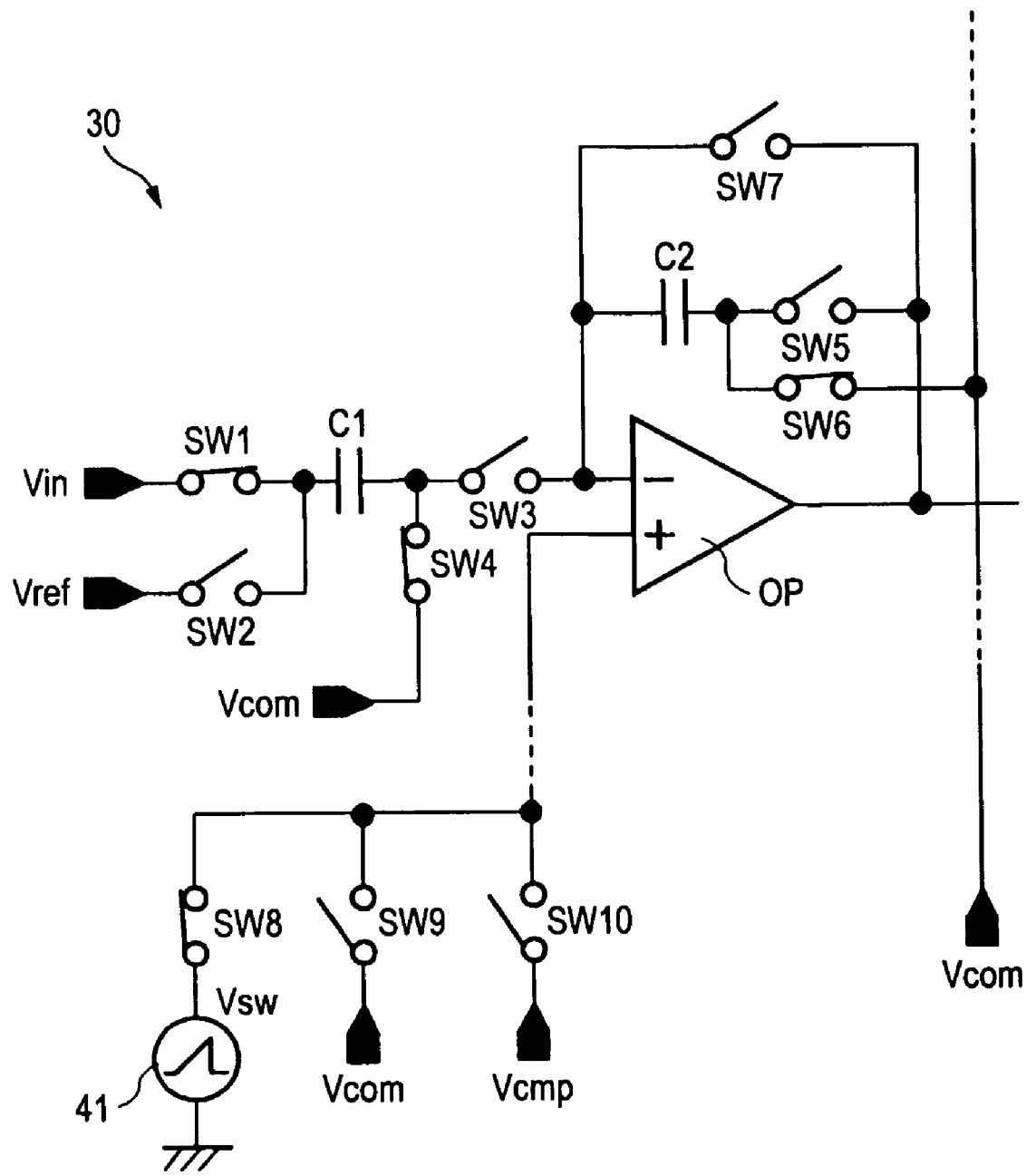
FIG. 3 is a circuit diagram showing the circuit configuration of an A/D conversion circuit according to an embodiment of the invention.

Next, the A/D conversion circuit, which is a feature of this embodiment, will be described in detail with reference to FIG. 3. FIG. 3 is a circuit diagram showing the circuit configuration of an A/D conversion circuit 30 according to an embodiment of the invention.

(Circuit Configuration of A/D Conversion Circuit)

The A/D conversion circuit 30 according to this embodiment includes 10 switches SW1 to SW10, two capacitances C1 and C2, and one operational amplifier OP. To the A/D conversion circuit 30, the pixel signal is applied from each of the pixels 20 in the selected row through the vertical signal line 111 as an input signal Vin.

The switch SW1 is turned on (closed)/turned off (opened) according to a control signal $\Phi in1$ to selectively load the input signal Vin. The switch SW2 is turned on/off according to a control signal $\Phi in2$ to selectively load a reference signal Vref. The capacitance C1 is an input capacitance, and one end thereof is commonly connected to the output ends of the switches SW1 and SW2.

One end of the switch SW3 (first switch) is connected to the other end of the input capacitance C1, and the other end thereof is connected to an inverting (−) input end (first input end) of the operational amplifier OP. The switch SW3 is turned on/off according to a control signal $\Phi i$ to appropriately connect the other end of the switch SW3 and the inverting input end of the operational amplifier OP. The switch SW4 is turned on/off according to a control signal $\Phi in3$ to selectively apply a common signal Vcom to the input end of the switch SW3.

The capacitance C2 is a feedback capacitance, and one end thereof is connected to the inverting input end of the operational amplifier OP. One end of the switch (second switch) SW5 is connected to the other end of the feedback capacitance C2, and the other end thereof is connected to an output end of the operational amplifier OP. The switch SW5 is turned on/off according to a control signal $\Phi b$ to selectively connect the feedback capacitance C2 between the inverting input end and the output end of the operational amplifier OP.

The switch SW6 (third switch) is turned on/off according to a control signal $\Phi bcom$ to selectively apply a predetermined voltage, for example, the voltage of the common signal Vcom, to the other end of the feedback capacitance C2. The switch (fourth switch) SW7 is turned on/off according to a control signal $\Phi s$ to selectively cause a short circuit between the inverting input end and the output end of the operational amplifier OP.

The switch (sixth switch) SW8 is turned on/off according to a control signal $\Phi gref$ to selectively load a reference voltage Vsw having a ramp waveform, which is applied from a reference voltage generating source 41, and to apply the reference voltage Vsw to the non-inverting (+) input end (second input end) of the operational amplifier OP.

The switch (fifth switch) SW9 is turned on/off according to a control signal $\Phi gcom$ to selectively load the common signal Vcom and to apply the common signal Vcom to the non-inverting input end of the operational amplifier OP. The switch SW10 is turned on/off according to a control signal $\Phi cpm$ to selectively load a comparison reference voltage Vcmp and to apply the comparison reference voltage Vcmp to the non-inverting input end of the operational amplifier OP.

The A/D conversion circuit 30 having the above-described configuration according to this embodiment amplifies the input signal Vin, and then performs A/D conversion. That is, the A/D conversion circuit 30 has a signal amplification function, as well as the A/D conversion function.

(Circuit Operation of A/D Conversion Circuit)

Hereinafter, the circuit operations of the A/D conversion circuit 30 according to this embodiment will be described in detail at the time of signal amplification and at the time of A/D conversion.

<Signal Amplification>

Figure 4:
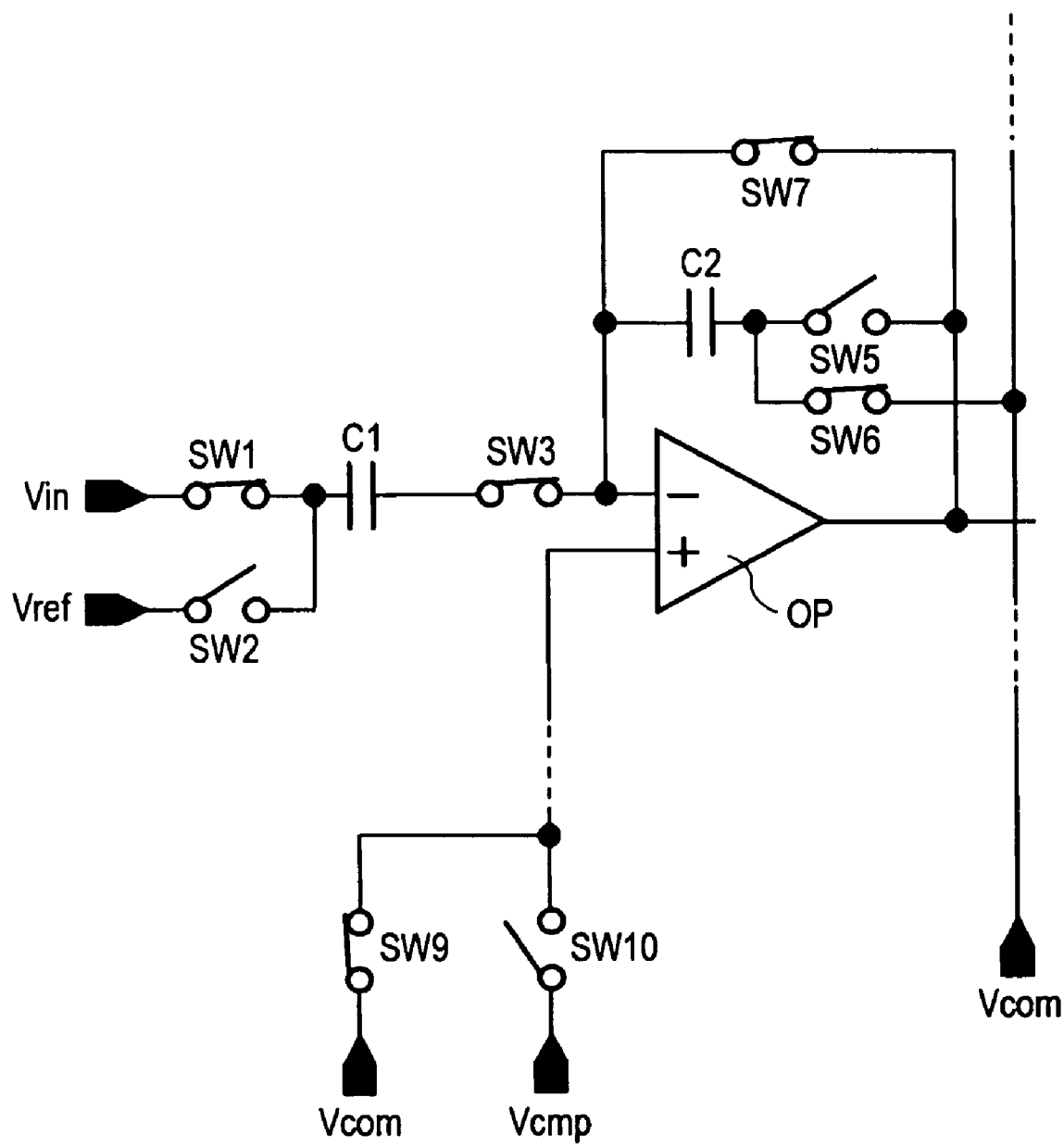
FIG. 4 is an explanatory view (first view) illustrating the operation when an A/D conversion circuit performs signal amplification.
Figure 5:
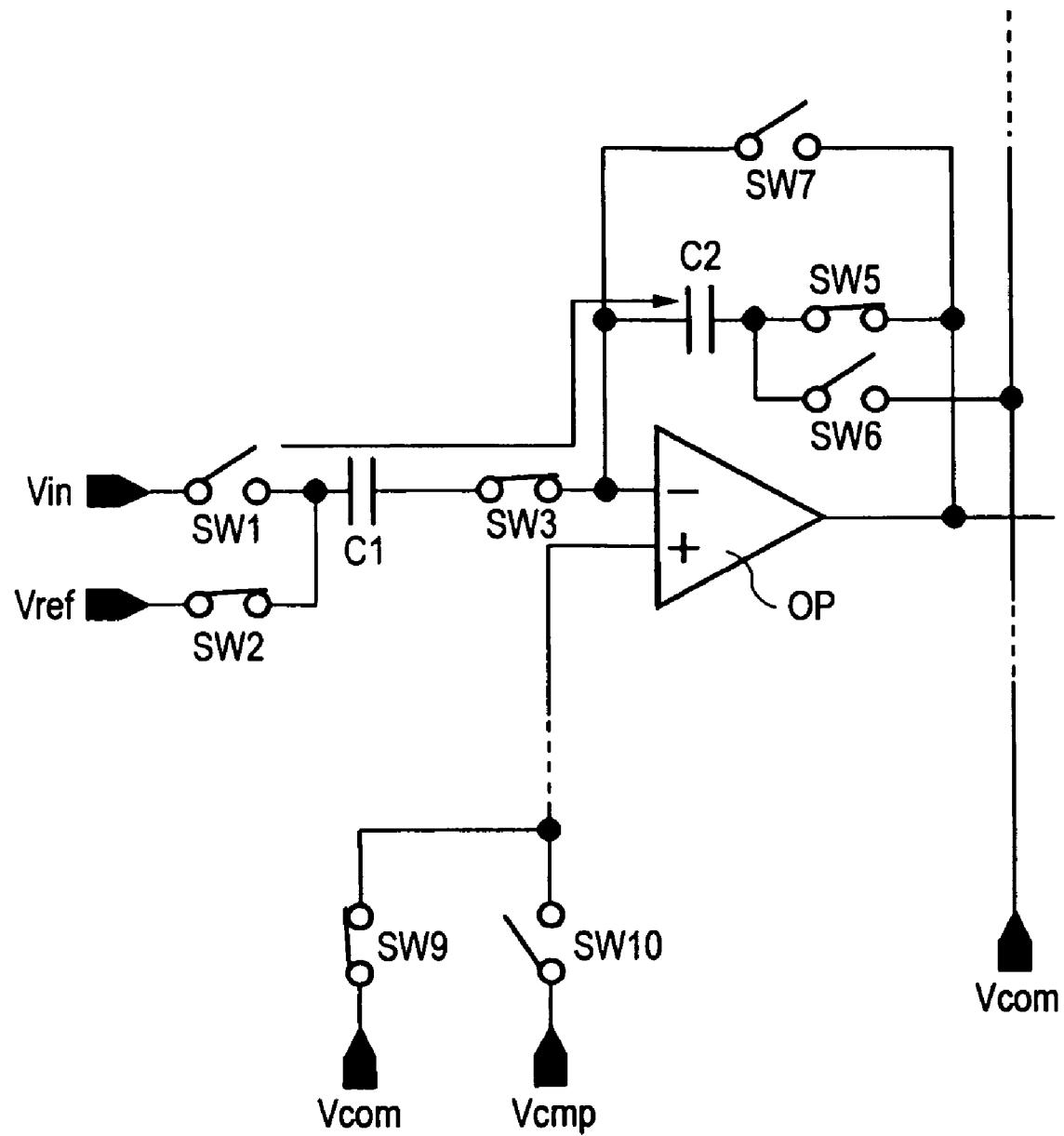
FIG. 5 is an explanatory view (second view) illustrating the operation when an A/D conversion circuit performs signal amplification.

First, a signal amplification operation will be described with reference to operation explanatory views of FIGS. 4 and 5 and a timing chart of FIG. 6. In FIGS. 4 and 5, the switches SW4 and SW8 are not shown because they are irrelevant to the signal amplification operation.

Sampling Phase

Referring to the timing chart of FIG. 6, the control signal $\Phi n1$ becomes the high level (hereinafter, referred to as '"H" level') at a time t11, and the switch SW1 is turned on. Then, the input signal Vin is input to one end of the input capacitance C1, such that a differential voltage between a voltage at a virtual ground (inverting input end) of the operational amplifier OP and the input signal Vin is accumulated (sampled and held) in the input capacitance C1 as an electric charge.

At this time, since the control signals $\Phi i$, $\Phi bcom$, $\Phi s$, and $\Phi gcom$ become the "H" level, as shown in FIG. 4, the switches SW3, SW6, SW7, and SW9 are also turned on. If the switches SW6 and SW9 are turned on, the potentials at both ends of the feedback capacitance C2 become the voltage of the common signal Vcom, and the charge accumulated in the feedback capacitance C2 is initialized to zero.

At a time t12, the control signal Φs becomes the low level (hereinafter, referred to as "'L' level'), and at a time t13, the control signal Φbcom becomes the "L" level, such that the switches SW6 and SW7 are turned off. Then, negative feedback is applied to the operational amplifier OP through the feedback capacitance C2. Accordingly, the potential at the inverting input end of the operational amplifier OP becomes the voltage of the common signal Vcom.

Transfer Phase

Subsequently, at a time t14, the control signal Φb becomes the "H" level, and at a time t15, the control signal Φin1 becomes the "L" level. Then, at a time t16, the control signal Φin2 becomes "H" level. Accordingly, as shown in FIG. 5, the switches SW2 and SW5 are turned on, and the switch SW1 is turned off.

If the switch SW2 is turned on, and the reference signal Vref is applied to one end of the input capacitance C1, the charge accumulated in the input capacitance C1 is transferred to the feedback capacitance C2 through the switch SW3. Then, a voltage, which is represented by the capacitance ratio C1/C2 of the capacitances C1 and C2, an input voltage difference, and the common signal Vcom, that is, $(C1/C2)\cdot(Vin-Vref)+Vcom$, appears at the output end of the operational amplifier OP.

In this way, the input signal Vin is amplified with the capacitance ratio C1/C2 of the capacitances C1 and C2. An electric charge, which generates an output voltage of the operational amplifier OP, that is, $(C1/C2)\cdot(Vin-Vref)+Vcom$, is accumulated in the feedback capacitance C2.

Here, in regard to the signal input, the input signal Vin and the reference signal Vref are sequentially input by switching the switches SW1 and SW2. Alternatively, instead of switching the switches SW1 and SW2, time-variant signals, that is, the P-phase signal (reset level) and the D-phase signal (signal level), may be sequentially input.

<Integral Arithmetic>

By performing integral arithmetic to repeat an integral operation for the above-described signal amplification a desired number of times, the signal may be further amplified. The integral arithmetic operation will be described with reference to a timing chart of FIG. 7. Here, a description will be given for an example where the desired number of times, that is, the number of integrals, is N. The number of integrals N may be arbitrarily determined according to a circuit designer.

Figure 6:
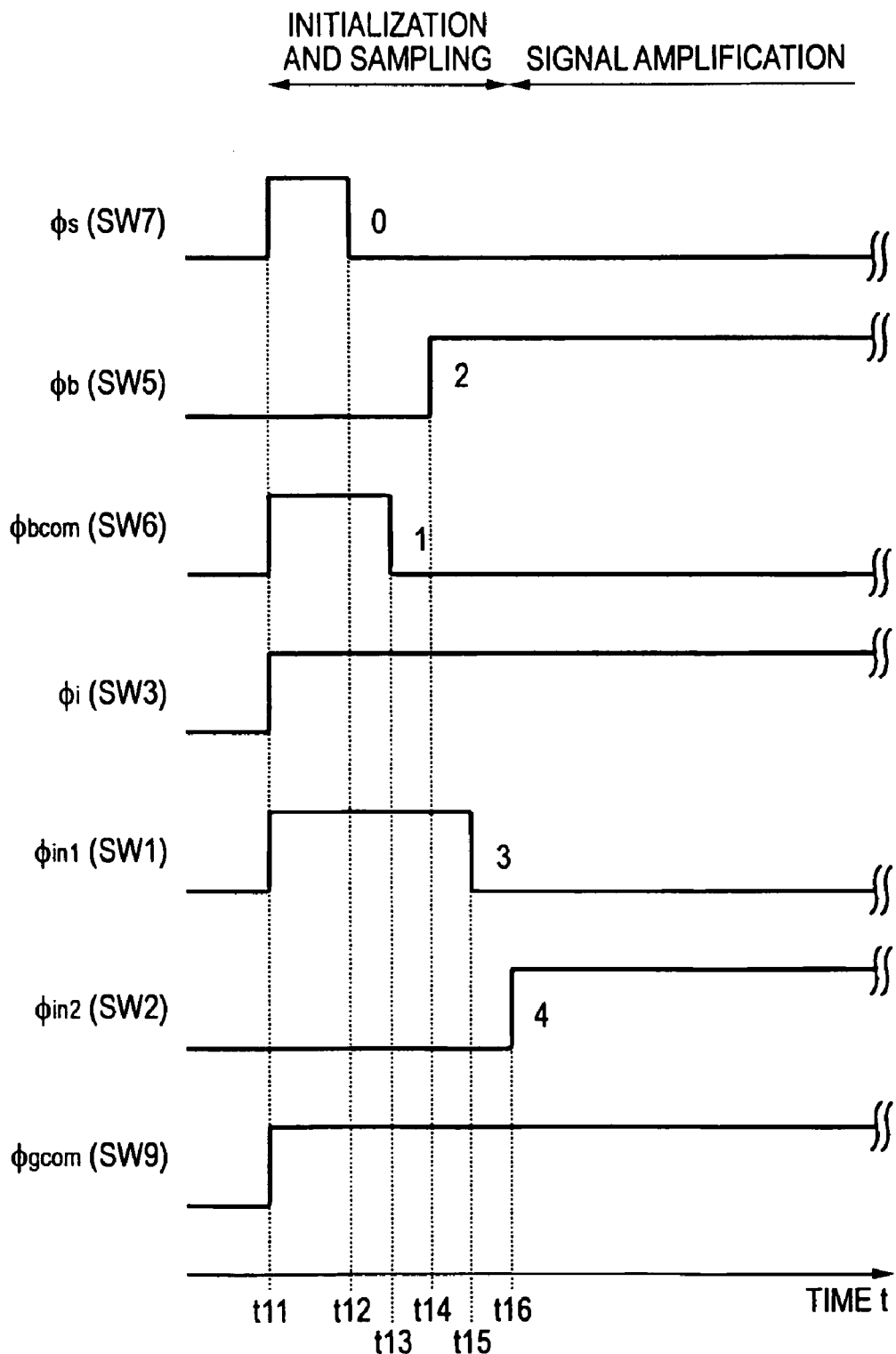
FIG. 6 is a timing chart used to explain the operation when an A/D conversion circuit performs signal amplification.
Figure 7:
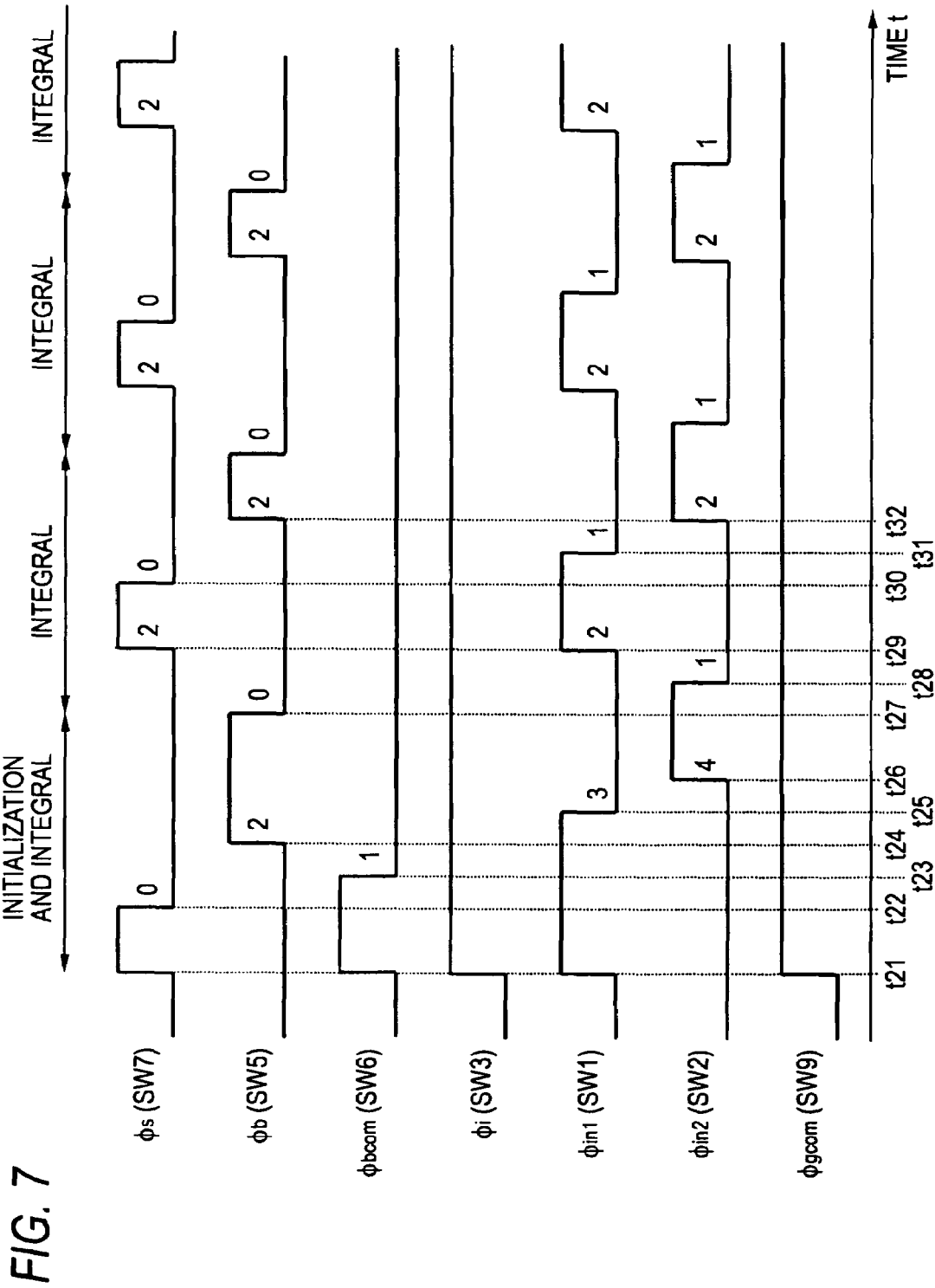
FIG. 7 is a timing chart used to explain the operation of integral arithmetic in an A/D conversion circuit.

Times t21 to t26 in the timing chart of FIG. 7 correspond to the times t11 to t16 in the timing chart of FIG. 6. That is, the electric charge, which generates the voltage after the signal amplification by the operations during the above-described sampling phase and transfer phase, that is, $(C1/C2)\cdot(Vin-Vref)+Vcom$, is accumulated in the feedback capacitance C2.

At a time t27, the control signal Φb becomes the "L" level, and the switch SW5 is turned off. Then, the other end of the feedback capacitance C2 becomes a high impedance state.

Next, at a time t28, the control signal Φin2 becomes the "L" level, and the switch SW2 is turned off. Subsequently, at a time t29, the control signal Φs becomes the "H" level, and the switch SW7 is turned on to cause a short circuit between the inverting input end and the output end of the operational amplifier OP. Simultaneously, the control signal Φin1 becomes the "H" level, and the switch SW1 is turned on to load the input signal Vin. If the inverting input end and the output end of the operational amplifier OP are short-circuited, an electric charge, which is determined by a short voltage and the voltage of the input signal Vin, is accumulated in the input capacitance C1.

Subsequently, at times t30 and t31, the control signal Φs and the control signal Φin1 sequentially become the "L" level, and the switches SW7 and SW1 are sequentially turned off. Next, at a time t32, the control signals Φb and Φin2 become the "H" level, and the switches SW5 and SW2 are turned on. Then, the electric charge accumulated in the input capacitance C1 by the operation during the transfer phase is transferred to the feedback capacitance C2.

If so, the electric charge newly transferred to the feedback capacitance C2 is synthesized with the electric charge previously transferred to the feedback capacitance C2. Accordingly, the output voltage of the operational amplifier OP becomes $2(C1/C2)\cdot(Vin-Vref)+Vcom$. By repeating the integral arithmetic operation N times, finally, a voltage $N(C1/C2)\cdot(Vin-Vref)+Vcom$ is output from the operational amplifier OP.

After the integral arithmetic operation is repeated N times, the control signal Φb becomes the "L" level to turn off the switch SW5, and the control signal Φbcom becomes the "H" level to turn on the switch SW6. Accordingly, a voltage at the inverting input end of the operational amplifier OP becomes the voltage $N(C1/C2)\cdot(Vin-Vref)+Vcom$.

In this way, for ease of understanding, if C1=C2, by repeating the integral arithmetic operation N times for signal amplification of the input signal Vin with the capacitance ratio C1/C2, the input signal Vin can be amplified N times.

Here, laying focus on random noise input to the column circuit 13 from the pixel 20 through the vertical signal line 111, in the A/D conversion circuit 30, input random noise VinN is sampled and held by the input capacitance C1 N times and added by the feedback capacitance C2. Accordingly, noise is distributed N times, and VoutN output from the A/D conversion circuit 30 becomes approximately $\sqrt{N}\cdot VinN$. Therefore, even if the input signal Vin is amplified N times, random noise does not become approximately $\sqrt{N}$ times, thereby obtaining a pixel signal having good S/N.

<A/D Conversion>

Figure 8:
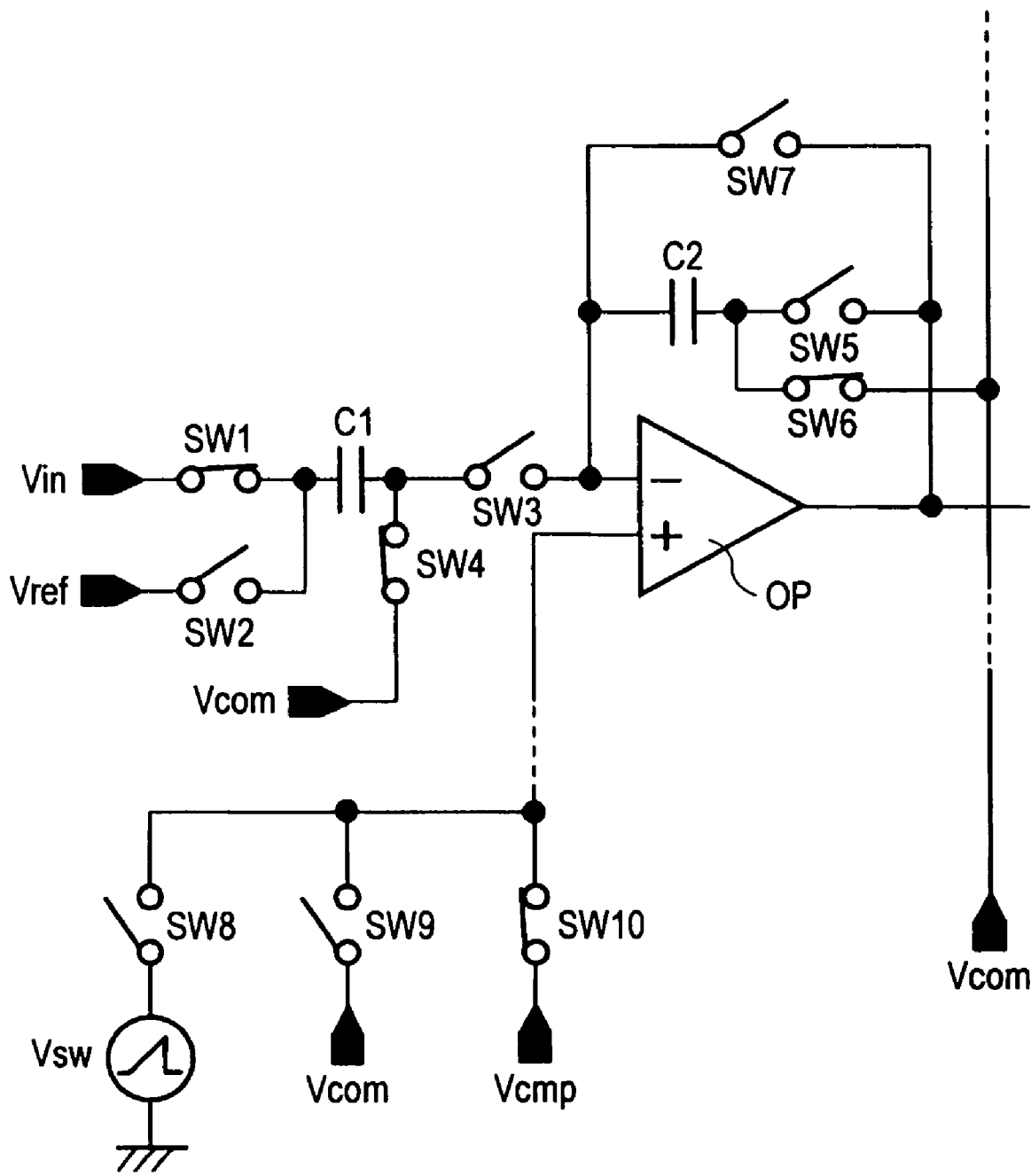
FIG. 8 is an explanatory view (first view) illustrating the operation when an A/D conversion circuit performs A/D conversion.
Figure 9:
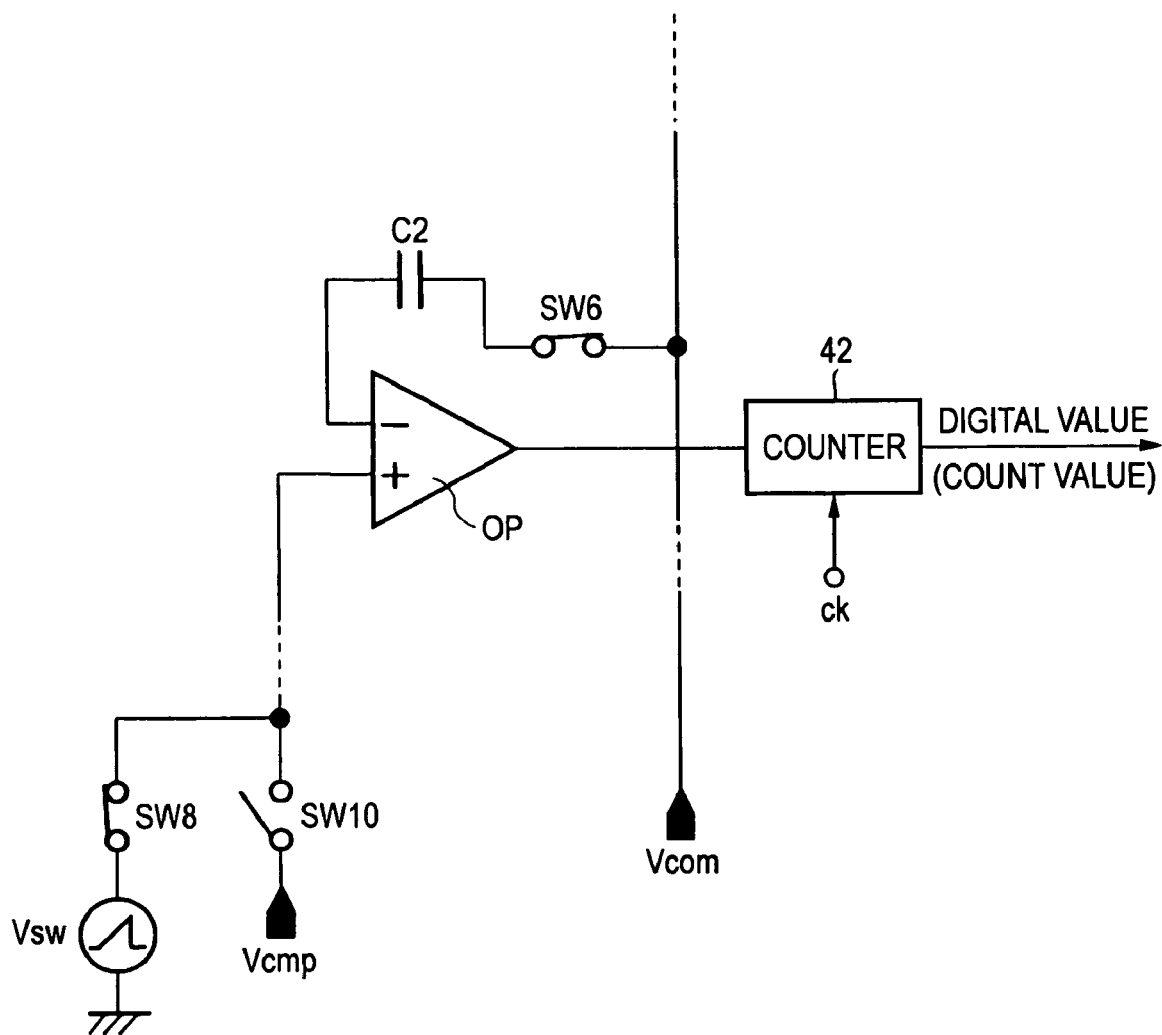
FIG. 9 is an explanatory view (second view) illustrating the operation when an A/D conversion circuit performs A/D conversion.

Next, an A/D conversion operation will be described with reference to operation explanatory views of FIGS. 8 and 9 and a timing chart of FIG. 10. In FIG. 9, the switches SW1 to SW3, SW5, SW7, and SW9, and the input capacitance C1 are not shown because they are irrelevant to the A/D conversion operation.

Figure 10:
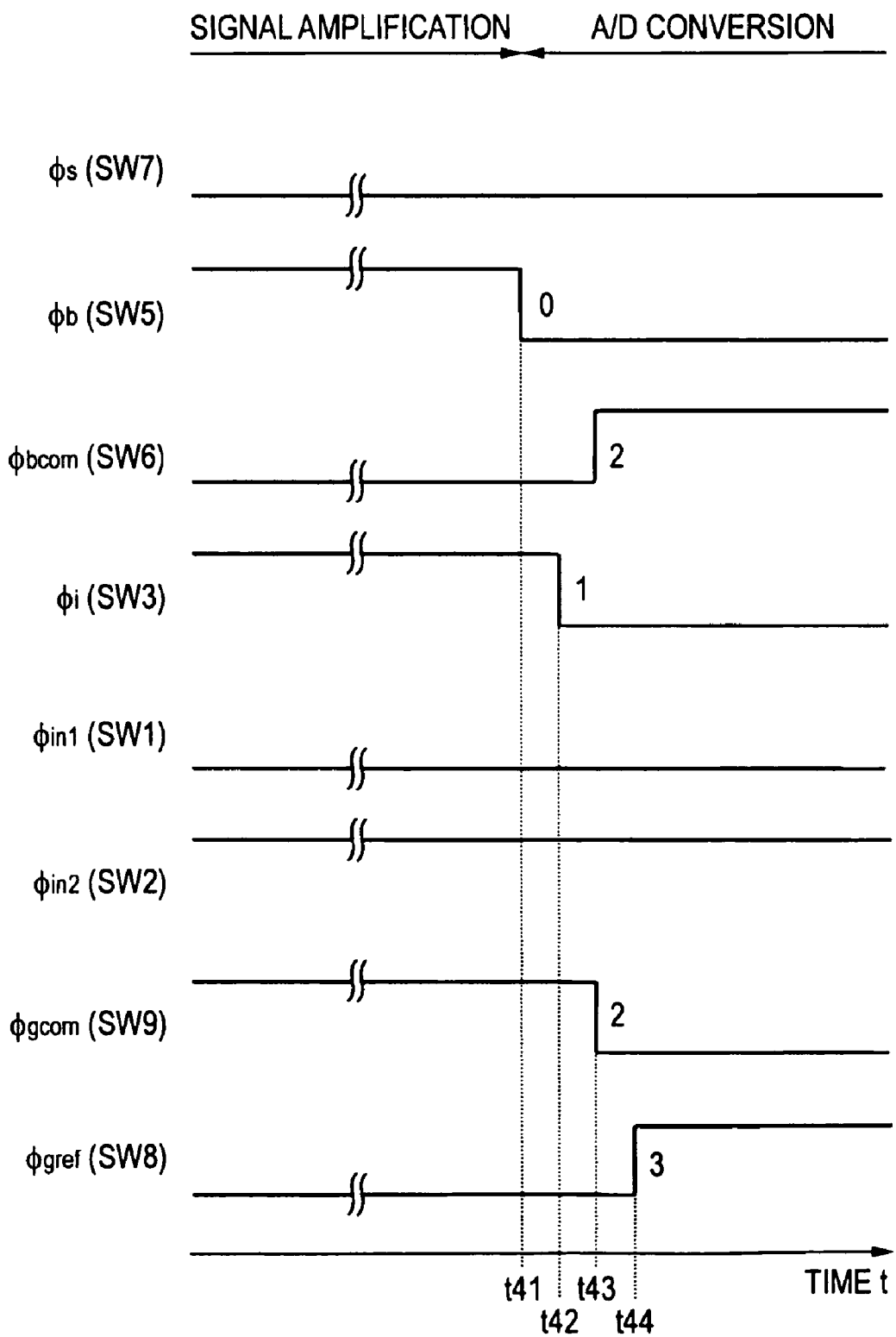
FIG. 10 is a timing chart used to explain the operation when an A/D conversion circuit performs A/D conversion.

Referring to the timing chart of FIG. 10, at a time t 41 at which the control signal Φb becomes the "L" level, and the switch SW5 is turned off, the signal amplification operation with the capacitance ratio C1/C2 is shifted to the A/D conversion operation, and the operational amplifier OP operates as a comparator.

Hereinafter, for ease of understanding, it is assumed that the voltage at the inverting input end of the operational amplifier OP is $(C1/C2)\cdot(Vin-Vref)+Vcom$.

Comparison Phase

After signal amplification, at the time t41, the switch SW5 is turned off. Next, at a time t42, the control signal Φi becomes the "L" level, and the switch SW3 is turned off. Subsequently, at a time t43, the control signals Φbcom and Φcmp become the "H" level, and the switches SW6 and SW10 are turned on.

If the switch SW6 is turned on, the voltage of the common signal Vcom is applied to the output end (the other end) of the feedback capacitance C2. At this time, the voltage Vcom at the output end of the feedback capacitance C2 may differ from the voltage at the time of initialization. The voltage Vcom is adjusted to an operation voltage of the comparator (operational amplifier OP).

In addition, if the switch SW10 is turned on, a comparison reference voltage Vcmp is applied to the non-inverting input end of the operational amplifier OP. Accordingly, the operational amplifier OP operates as a comparator to compare the voltage (C1/C2)·(Vin−Vref) with the comparison reference voltage Vcmp.

With the comparison operation, if (C1/C2)·(Vin−Vref) >Vcmp, the integral arithmetic operation for signal amplification is interrupted. If (C1/C2)·(Vin−Vref)≦Vcmp, the flow returns to the sampling phase, and the integral arithmetic operation is performed again (Adaptive Integral Operation).

A/D Conversion Phase

Subsequently, at a time t44, the control signal Φgref becomes the "H" level, and the switch SW8 is turned on, such that the ramp-waveform reference voltage Vsw is applied to the non-inverting input end of the operational amplifier OP. The reference voltage Vsw is needed for A/D conversion and temporally varies with a predetermined slope.

The comparator (operational amplifier OP), which sets the reference voltage Vsw as the comparison reference voltage, and compares the reference Vsw with the input voltage (C1/C2)·(Vin−Vref), and a counter 42, which is connected to the output end of the comparator, as shown in FIG. 9, constitute the A/D conversion circuit 30 according to this embodiment, that is, an integral-type A/D conversion circuit.

In the integral-type A/D conversion circuit 30, the counter 42 performs a count operation in synchronization with a clock CK having a predetermined cycle, and simultaneously starts the count operation at a timing when the reference voltage Vsw is applied to the non-inverting input end of the operational amplifier OP (time t44). The counter 42 stops the count operation in response to the output (comparison output) of the operational amplifier OP when the input voltage (C1/C2)· (Vin−Vref) exceeds the reference voltage Vsw.

That is, the operational amplifier OP, which operates as the comparator, converts the input voltage (C1/C2)·(Vin−Vref) into information in a time-axis direction by comparing the input voltage (C1/C2)·(Vin−Vref) with the ramp-waveform reference voltage Vsw.

Then, the counter 42 performs the count operation in synchronization with the clock CK during a period from the start time to the end time of the comparison operation in the operational amplifier OP, thereby converting the information in the time-axis direction into a count value (digital value). As a result, the input voltage (C1/C2)·(Vin−Vref) is converted into a digital value.

<A/D Conversion After Integral Arithmetic>

Figure 11:
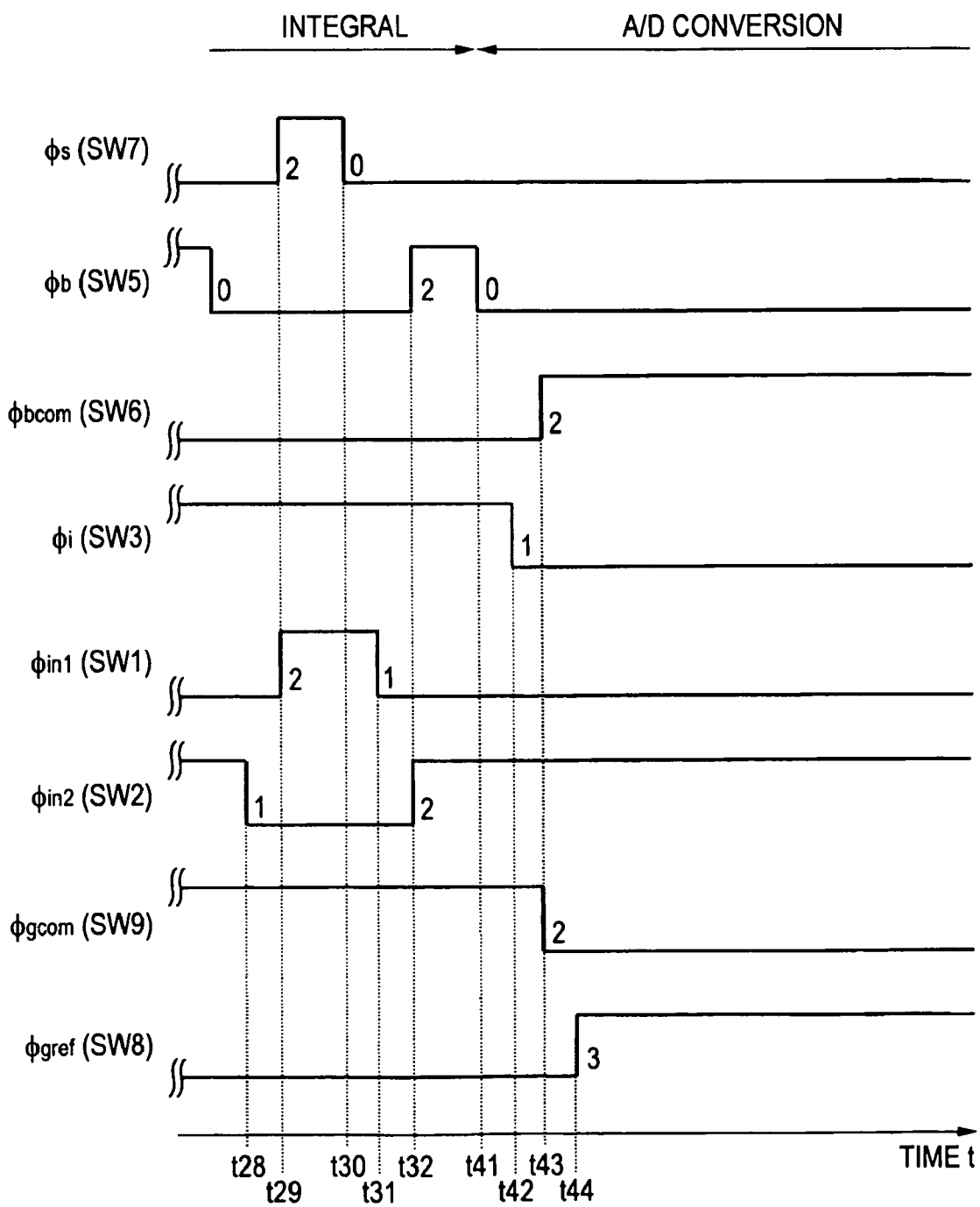
FIG. 11 is a timing chart showing a timing relationship when signal amplification is performed by an operation of integral arithmetic and then A/D conversion is performed.

FIG. 11 shows the timing relationship when A/D conversion is performed after signal amplification by the integral arithmetic operation.

Times t28 to t32 in the timing chart of FIG. 11 correspond to the times t28 to t32 in the timing chart of FIG. 7, and times t41 to t44 in the timing chart of FIG. 11 correspond to the times t41 to t44 in the timing chart of FIG. 10.

That is, during an integral period, the same operation as the above-described integral arithmetic operation based on the timing chart of FIG. 7 is performed. In addition, during an A/D conversion period, the same operation as the above-described A/D conversion operation based on the timing chart of FIG. 10 is performed.

In the foregoing description of the circuit operation, signal amplification is initially performed with the capacitance ratio C1/C2 or integral arithmetic. Alternatively, before signal amplification is performed with the capacitance ratio C1/C2 or integral arithmetic, the circuit may operate as a comparator to determine the amplitude of the input signal Vin, and may perform signal amplification with an amplification factor according to the amplitude of the input signal Vin.

Specifically, the amplitude of the input signal Vin is determined, and if the input signal Vin is equal to or larger than a predetermined threshold value, signal amplification is performed with a comparatively low amplification factor. Meanwhile, when the input signal Vin is less than the predetermined threshold value, signal amplification is performed with a comparatively high amplification factor. In this way, appropriate signal amplification can be performed according to the amplitude of the input signal Vin.

The amplification factor for signal amplification is determined depending on the capacitance ratio C1/C2. Accordingly, by changing the capacitance value of at least one of the capacitances C1 and C2 according to the amplitude of the input signal Vin, the amplification factor according to the amplitude of the input signal Vin can be set.

Advantages of Embodiment

As described above, in addition to the operational amplifier OP, the feedback capacitance C2, and the switches SW6 and SW8 (see FIG. 9), which are needed for the operation of the integral-type A/D conversion, at least the input capacitance C1 and the switches SW3 to SW4, SW7, SW9, and SW10 are further provided. In addition, each of the switches SW3 to SW4, SW7, SW9, and SW10 is turned on/off at an appropriate timing. With this configuration, A/D conversion can be performed after the input signal Vin is amplified. Therefore, the A/D conversion circuit 30 having a signal amplification function can be implemented.

As such, by executing the signal amplification operation at different times using the circuit elements of the A/D conversion circuit 30, the circuit elements can be commonly used for A/D conversion and signal amplification. Therefore, the occupation area of the A/D conversion circuit can be reduced, compared with the signal amplifying circuit is simply incorporated with the integral-type A/D conversion circuit.

If the input signal Vin has a small amplitude, due to the effects of integral arithmetic, noise of the input signal Vin can be reduced on an input equivalent basis. Therefore, an integral-type AID conversion circuit having good S/N can be implemented.

When the input signal Vin has a small amplitude, since the input signal Vin is amplified by the signal amplification function, the temporal slope of the reference voltage Vsw can be roughened, and as a result, fast and low-power consumption AID conversion can be realized. When the temporal slope of the reference voltage Vsw is not roughened, the resolution when the input signal Vin has a small amplitude can be improved due to the effects of integral arithmetic.

Although a case where the AID conversion circuit 30 is provided within the column circuit 13 has been described in the foregoing embodiment, the invention can also be applied to a case where the AID conversion circuit 30 is provided within the output circuit 15 or at the back of the output circuit 15.

If the A/D conversion circuit, which is provided within the column circuit 13, is used, for example, when the column circuit 13 is arranged for each pixel column, the occupation area of the A/D conversion circuit for each pixel column can be reduced. Therefore, it is very effective for reduction in the occupation area of the entire column circuit part.

The A/D conversion circuit 30 according to this embodiment is not limitedly applied a solid-state imaging device, such as the CMOS image sensor 10, in which the unit pixels are arranged in a matrix to detect a signal charge according to the amount of visible light as a physical quantity. The A/D conversion circuit 30 may be used as a general integral-type A/D conversion circuit having a signal amplification function.

By applying the A/D conversion circuit 30 to a solid-state imaging device, such as the CMOS image sensor 10, the following advantages can be obtained. That is, when the A/D conversion circuit 30 is applied to a solid-state imaging device, A/D conversion may be performed while varying the amplification factor for each pixel. In this case, the voltage of the common signal Vcom shown in FIG. 3 is switched to the comparison reference voltage Vcmp and set as a threshold value for comparison.

In the solid-state imaging device, a pixel signal (input signal) having small amplitude becomes a signal at the time of low illuminance. Accordingly, as will be apparent from the above-described advantages, in a low-illuminance region, noise of the pixel signal can be reduced, fast and low-power consumption A/D conversion can be realized, and the resolution can be improved.

A pixel signal having large amplitude becomes a signal at the time of high illuminance. A high-illuminance region is a region where shot noise is dominant, and high resolution is not needed. Accordingly, at the time of high illuminance, by roughening the resolution, a fast A/D conversion operation can be realized.

[Modifications]

The invention is not limitedly applied to a solid-state imaging device, which detects the distribution of the incident amount of visible light and takes it as an image. For example, the invention may be applied to a solid-state imaging device, which takes the distribution of the incident amount of infrared rays or X rays, or particles, as an image, or in a broad sense, a solid-state imaging device (physical quantity distribution detection device), such as a fingerprint detection sensor, which detects the distribution of a physical quantity, such as pressure or electrostatic capacitance, and takes it as an image.

The solid-state imaging device may be constituted from one chip or an imaging function-equipped module, in which an imaging part, a signal processing part, and an optical system are collectively packaged.

The invention is not limitedly applied to a solid-state imaging device, but it may be applied to an imaging apparatus. Here, the imaging apparatus means an electronic apparatus having an imaging function, such as a camera system (for example, a digital still camera or a video camera), or a cellular phone. Moreover, the above-described module-type solid-state imaging device, which is mounted on an electronic apparatus, that is, a camera module, may be an imaging apparatus.

[Imaging Apparatus]

Figure 12:
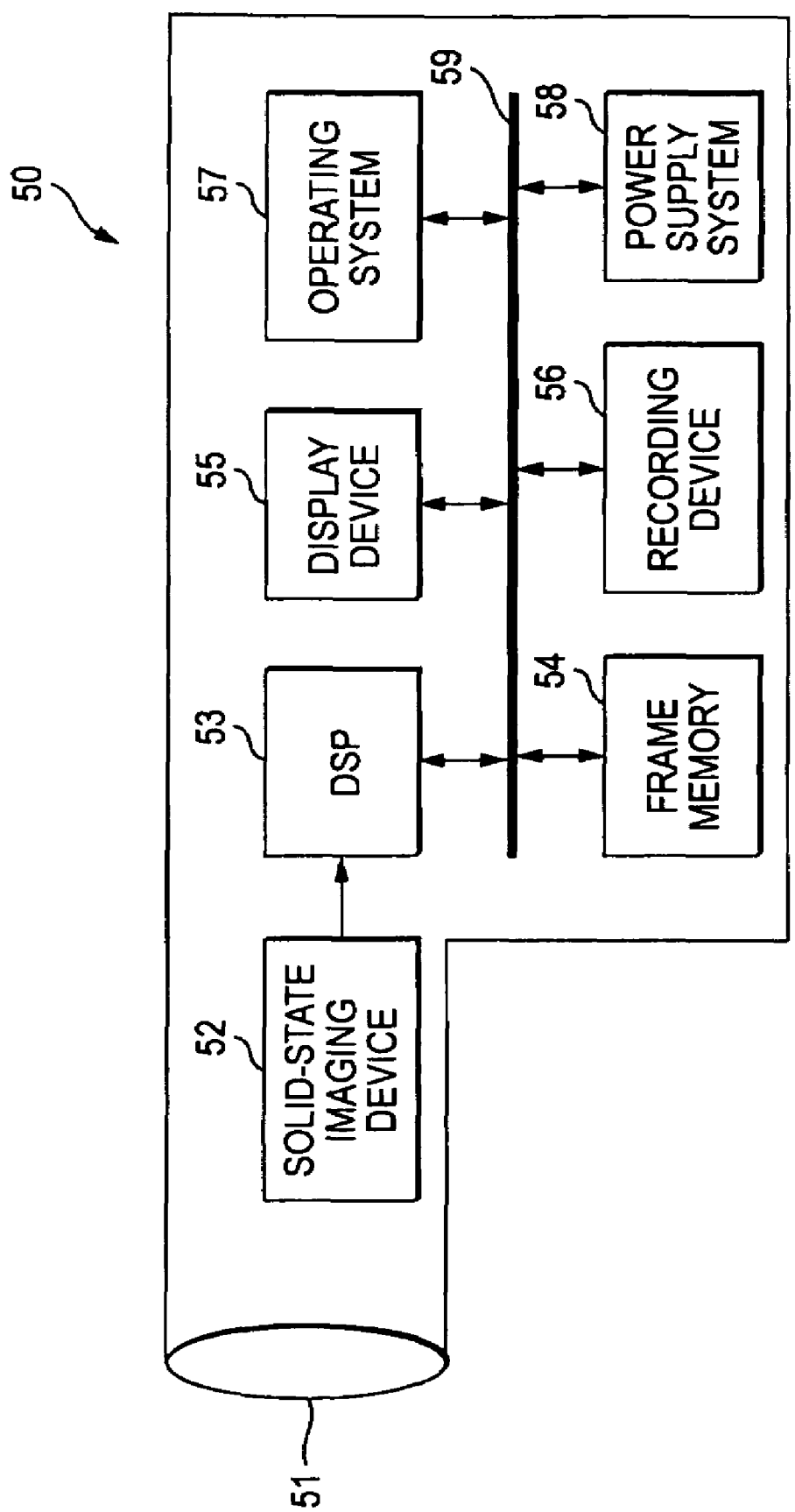
FIG. 12 is a block diagram showing an example of an imaging apparatus according to an embodiment of the invention.

FIG. 12 is a block diagram showing an example of an imaging apparatus according to an embodiment of the invention. As shown in FIG. 12, an imaging apparatus 50 according to an embodiment of the invention includes an optical system having a lens array 51, a solid-state imaging device 52, a DSP circuit 53 as a camera signal processing circuit, a frame memory 54, a display device 55, a recording device 56, an operating system 57, a power supply system 58, and the like. The DSP circuit 53, the frame memory 54, the display device 55, the recording device 56, the operating system 57, and the power supply system 58 are connected with each other through a bus line 59.

The lens array 51 focuses incident light (image light) from a subject on an imaging surface of the solid-state imaging device 52. The solid-state imaging device 52 converts the amount of incident light focused on the imaging surface by the lens array 51 into an electrical signal on the pixel basis, and outputs the electrical signal as a pixel signal. As the solid-state imaging device 52, the CMOS image sensor 10 according to the foregoing embodiment is used.

The display device 55 is constituted from a panel-type display device, such as a liquid crystal display or an organic EL (electroluminescence) display. The display device 55 displays a motion picture or a still picture captured by the solid-state imaging device 52. The recording device 56 records the motion picture or the still picture, which is captured by the solid-state imaging device 52, in a recording medium, such as a video tape or a DVD (Digital Versatile Disk).

The operating system 57 issues an operation instruction of each function of the imaging apparatus according to the user's operation. The power supply system 58 appropriately supplies power to each of the DSP circuit 53, the frame memory 54, the display device 55, the recording device 56, and the operating system 57 to flow an operation current therein.

As described above, in the imaging apparatus, for example, a video camera, a digital still camera, or a camera module for a mobile apparatus, such as a cellular phone, as the solid-state imaging device 52, the CMOS image sensor 10 according to the foregoing embodiment is used. Therefore, in the CMOS image sensor 10, the occupation area of the column circuit provided in the A/D conversion circuit can be reduced, and as a result, a compact imaging apparatus can be implemented.

It should be understood by those skilled in the art that various modifications, combinations, sub-combinations and alterations may occur depending on design requirements and other factors insofar as they are within the scope of the appended claims or the equivalents thereof.

What is claimed is:

1. An A/D conversion circuit, comprising:

an input capacitance, to one end of which an input signal and a reference signal are sequentially applied;

an operational amplifier;

a first switch that is connected between the other end of the input capacitance and a first input end of the operational amplifier, and is turned on at the time of a signal amplification operation;

a feedback capacitance, one end of which is connected to the first input end of the operational amplifier;

a second switch that is connected between the other end of the feedback capacitance and an output end of the operational amplifier, and is turned on when an electric charge accumulated in the input capacitance is transferred to the feedback capacitance;

a third switch that selectively applies a predetermined voltage to the other end of the feedback capacitance when the input signal is applied to the one end of the input capacitance or at the time of an A/D conversion operation;

a fourth switch that, when the input signal is applied to the one end of the input capacitance, selectively causes a short circuit between the first input end and the output end of the operational amplifier;

a fifth switch that, when the input signal and the reference signal are applied to the one end of the input capacitance, applies the predetermined voltage to a second input end of the operational amplifier; and a sixth switch that is turned on at the time of the A/D conversion operation to apply a ramp reference voltage to the second input end of the operational amplifier.

2. A control method of an A/D conversion circuit, wherein the A/D conversion circuit includes an input capacitance, an operational amplifier, a first switch that is connected between the other end of the input capacitance and a first input end of the operational amplifier, a feedback capacitance, one end of which is connected to the first input end of the operational amplifier, a second switch that is connected between the other end of the feedback capacitance and an output end of the operational amplifier, a third switch that applies a predetermined voltage to the other end of the feedback capacitance, a fourth switch that is connected between the first input end and the output end of the operational amplifier, a fifth switch that, when the input signal is applied to the one end of the input capacitance, applies the predetermined voltage to a second input end of the operational amplifier, and a sixth switch that applies a ramp reference voltage to the second input end of the operational amplifier, the control method comprising the steps of:

tuning on the first switch, the third switch, the fourth switch, and the fifth switch to sample and hold the input signal in the input capacitance;

turning on the second switch and turning off the third switch and the fourth switch to apply a reference signal to the one end of the input capacitance, and to transfer an electric charge accumulated in the input capacitance to the feedback capacitance, thereby performing a signal amplification operation; and after the signal amplification operation, turning off the first switch, the second switch, and the fourth switch, and turning on the third switch and the fifth switch to apply the ramp reference voltage to the second input end of the operational amplifier through the fifth switch, thereby performing an A/D conversion operation.

3. The control method of an A/D conversion circuit according to claim 2, wherein the signal amplification operation is repeatedly performed a predetermined number of times.

4. The control method of an A/D conversion circuit according to claim 3, wherein, after the signal amplification operation, a voltage at the first input end of the operational amplifier is compared with a reference voltage, if the voltage at the first input end is larger than the reference voltage, the A/D conversion operation is performed, and if the voltage at the first input end is equal to or less than the reference voltage, the signal amplification operation is repeatedly performed.

5. The control method of an A/D conversion circuit according to claim 2, wherein, before the signal amplification operation, the amplitude of the input signal is determined, and an amplification factor at the time of the signal amplification operation according to the amplitude of the input signal is set depending on a ratio between the input capacitance and the feedback capacitance, the repetitive transfer of the electric charge to the feedback capacitance, or a combination thereof.

6. A solid-state imaging device, comprising:

a pixel array part, in which unit pixels each having a photoelectric conversion element are arranged; and an A/D conversion circuit that converts pixel signals to be output from the individual pixels of the pixel array part into digital signals, wherein the A/D conversion circuit includes an input capacitance, to one end of which the input signal and a reference signal are sequentially applied, an operational amplifier, a first switch that is connected between the other end of the input capacitance and a first input end of the operational amplifier, and is turned on at the time of a signal amplification operation, a feedback capacitance, one end of which is connected to the first input end of the operational amplifier, a second switch that is connected between the other end of the feedback capacitance and an output end of the operational amplifier, and is turned on when an electric charge accumulated in the input capacitance is transferred to the feedback capacitance, a third switch that, when the pixel signal is applied to the one end of the input capacitance, or at the time of the A/D conversion operation, selectively applies a predetermined voltage to the other end of the feedback capacitance, a fourth switch that, when the pixel signal is applied to the one end of the input capacitance, selectively causes a short circuit between the first input end and the output end of the operational amplifier, a fifth switch that, when the pixel signal and the reference signal are applied to the one end of the input capacitance, applies the predetermined voltage to a second input end of the operational amplifier, and a sixth switch that is turned on at the time of the A/D conversion operation to apply a ramp reference voltage to the second input end of the operational amplifier.

7. The solid-state imaging device according to claim 6, wherein the A/D conversion circuit is provided for each column or for every multiple columns of a pixel arrangement of the pixel array part.

8. The solid-state imaging device according to claim 6, wherein the pixel signal is at a signal level according to an electric charge, which is photoelectrically converted by the photoelectric conversion element, and the reference signal is at a reset level when the unit pixel is reset.

9. An imaging apparatus, comprising:

a solid-state imaging device that includes a pixel array part, in which unit pixels each having a photoelectric conversion element are arranged, and an A/D conversion circuit, which converts pixel signals to be output from the individual pixels of the pixel array part into digital signals; and an optical system that focuses incident light on an imaging surface of the solid-state imaging device, wherein the A/D conversion circuit includes an input capacitance, to one end of which the input signal and a reference signal are sequentially applied, an operational amplifier, a first switch that is connected between the other end of the input capacitance and a first input end of the operational amplifier, and is turned on at the time of a signal amplification operation, a feedback capacitance, one end of which is connected to the first input end of the operational amplifier, a second switch that is connected between the other end of the feedback capacitance and an output end of the operational amplifier, and is turned on when an electric charge accumulated in the input capacitance is transferred to the feedback capacitance, a third switch that, when the pixel signal is applied to the one end of the input capacitance, or at the time of the A/D conversion operation, selectively applies a predetermined voltage to the other end of the feedback capacitance, a fourth switch that, when the pixel signal is applied to the one end of the input capacitance, selectively causes a short circuit between the first input end and the output end of the operational amplifier, a fifth switch that, when the pixel signal and the reference signal are applied to the one end of the input capacitance, applies the predetermined voltage to a second input end of the operational amplifier, and a sixth switch that is turned on at the time of the A/D conversion operation to apply a ramp reference voltage to the second input end of the operational amplifier.

* * * * *